United States Patent
Di Sarro et al.

(10) Patent No.: US 9,064,786 B2
(45) Date of Patent: Jun. 23, 2015

(54) DUAL THREE-DIMENSIONAL (3D) RESISTOR AND METHODS OF FORMING

(71) Applicant: International Business Machines Corporation, Armonk, NY (US)

(72) Inventors: James P. Di Sarro, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/828,936

(22) Filed: Mar. 14, 2013

(65) Prior Publication Data
US 2014/0264752 A1    Sep. 18, 2014

(51) Int. Cl.
*H01L 21/20* (2006.01)
*H01L 49/02* (2006.01)
*H01L 23/522* (2006.01)

(52) U.S. Cl.
CPC ............ *H01L 28/20* (2013.01); *H01L 23/5228* (2013.01); *H01L 28/24* (2013.01); *H01L 2924/0002* (2013.01)

(58) Field of Classification Search
CPC . H01L 27/0802; H01L 28/20; H01L 23/5228; H01L 23/53238; H01L 23/53295
USPC .......... 257/296, 363, 528, 536; 438/381, 382, 438/386
See application file for complete search history.

(56) References Cited

U.S. PATENT DOCUMENTS

| | | |
|---|---|---|
| 2,273,838 A | 2/1942 | Dawson |
| 3,226,541 A | 12/1965 | Brinker et al. |
| 3,671,667 A | 6/1972 | Thorpe |
| 4,598,195 A | 7/1986 | Matsuo |
| 4,677,347 A | 6/1987 | Nakamura |
| 5,617,236 A | 4/1997 | Wang et al. |
| 5,786,921 A | 7/1998 | Wang et al. |
| 7,186,020 B2 | 3/2007 | Taya et al. |
| 7,262,980 B2 | 8/2007 | Phadke et al. |
| 7,387,747 B2 | 6/2008 | Taya et al. |
| 7,394,110 B2 | 7/2008 | Coolbaugh et al. |

(Continued)

OTHER PUBLICATIONS

Semiconductor Manufacturing Technology by Michael Quirk et al. (ISBN 0-13-081520-9) MichaelQuirk.pdf.*

(Continued)

*Primary Examiner* — Jae Lee
*Assistant Examiner* — Mohammed R Alam
(74) *Attorney, Agent, or Firm* — Anthony J. Canale; Hoffman Warnick LLC (57) ABSTRACT

Various embodiments include dual three-dimensional (3D) resistor structures and methods of forming such structures. In some embodiments, a dual 3D resistor structure includes: a dielectric layer having a first set of trenches extending in a first direction through the dielectric layer; and a second set of trenches overlayed on the first set of trenches, the second set of trenches extending in a second direction through the dielectric layer, the second set of trenches and the first set of trenches forming at least one dual 3D trench; and a resistor material overlying the dielectric layer and at least partially filling the at least one dual 3D trench along the first direction and the second direction.

10 Claims, 8 Drawing Sheets

(56) References Cited

U.S. PATENT DOCUMENTS

| | | |
|---|---|---|
| 7,485,540 B2 | 2/2009 | Chinthakindi et al. |
| 7,488,682 B2 | 2/2009 | Yang |
| 7,499,299 B2 | 3/2009 | Phadke et al. |
| 7,528,048 B2 | 5/2009 | Coolbaugh et al. |
| 7,902,605 B2 | 3/2011 | Anceau |
| 7,906,816 B2 | 3/2011 | Sugimae et al. |
| 8,035,228 B2 | 10/2011 | Yang |
| 8,232,169 B2 * | 7/2012 | Anceau .......... 438/284 |
| 2001/0050408 A1 | 12/2001 | Bernstein et al. |
| 2004/0021226 A1 | 2/2004 | Geffken et al. |
| 2007/0123015 A1 | 5/2007 | Chinthakindi et al. |
| 2009/0278595 A1 | 11/2009 | Braithwaite |
| 2010/0155893 A1 | 6/2010 | Chen et al. |
| 2010/0237467 A1 | 9/2010 | Dalton et al. |

OTHER PUBLICATIONS

Quirk, Michael, and Julian Serda. Semiconductor Manufacturing Technology. Upper Saddle River, NJ: Prentice Hall, 2001 ISBN 0-13-081520-9.*

* cited by examiner

DUAL THREE-DIMENSIONAL (3D) RESISTOR AND METHODS OF FORMING

FIELD

The subject matter disclosed herein relates to integrated circuit devices. More particularly, the subject matter relates to resistor structures in integrated circuit devices.

BACKGROUND

As integrated circuit technologies have advanced, the size of these devices has correspondingly decreased. In particular, as devices are reduced in scale to comply with ever-smaller packaging, tighter constraints are applied to their dimensions and spacings. In the case of resistors, these constraints can limit the performance of the resistor.

For example, in silicon-on-insulator (SOI) technologies, thickness constraints can impact resistor designs. In some cases, such as in partially depleted SOI (PDSOI) structures, fully depleted SOI (FDSOI) structures and/or extremely thin SOI (ETSOI) structures, thickness constraints on resistors in these structures can limit the current carrying ability of those resistors. Further, these thickness constraints can result in resistors filling a disproportionally larger area in order to meet the same reliability requirements.

SUMMARY

Various embodiments include dual three-dimensional (3D) resistor structures and methods of forming such structures. In some embodiments, a dual 3D resistor structure includes: a dielectric layer having: a first set of trenches extending in a first direction through the dielectric layer; and a second set of trenches overlying the first set of trenches, the second set of trenches extending in a second direction through the dielectric layer, the second set of trenches and the first set of trenches forming at least one dual 3D trench; and a resistor material overlying the dielectric layer and at least partially filling the dual 3D trench along the first direction and the second direction.

A first aspect of the invention includes a dual 3D resistor structure having: a dielectric layer having: a first set of trenches extending in a first direction through the dielectric layer; and a second set of trenches overlying the first set of trenches, the second set of trenches extending in a second direction through the dielectric layer, the second set of trenches and the first set of trenches forming at least one dual 3D trench; and a resistor material overlying the dielectric layer and at least partially filling the dual 3D trench along the first direction and the second direction.

A second aspect of the invention includes a method of forming a dual three-dimensional (3D) resistor structure in a front end of line (FEOL) process, the method including: providing a FEOL dielectric material layer; forming a first set of trenches in a first direction through the FEOL dielectric layer; forming a second set of trenches overlying the first set of trenches in a second direction through the FEOL dielectric layer, the second set of trenches and the first set of trenches forming at least one dual 3D trench; and forming a resistor material over the FEOL dielectric layer and at least partially filling the dual 3D trench along the first direction and the second direction.

A third aspect of the invention includes a method of forming a dual three-dimensional (3D) resistor structure in a back end of line (BEOL) process, the method including: providing a BEOL dielectric material layer; forming a first set of trenches in a first direction through the FEOL dielectric layer; forming a second set of trenches overlying the first set of trenches in a second direction through the BEOL dielectric layer, the second set of trenches and the first set of trenches forming at least one dual 3D trench; and forming a resistor material over the BEOL dielectric layer and at least partially filling the dual 3D trench along the first direction and the second direction.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit devices. More particularly, the subject matter relates to resistor structures in integrated circuit devices.

As noted herein, in silicon-on-insulator (SOI) technologies, thickness constraints can impact resistor designs. In some cases, such as in partially depleted SOI (PDSOI) structures, fully depleted SOI (FDSOI) structures and/or extremely thin SOI (ETSOI) structures, thickness constraints on the resistors in these structures can limit the current carrying ability of those resistors. Further, these thickness constraints can result in resistors filling a disproportionally larger area in order to meet the same reliability requirements.

In comparison with conventional resistor structures, various embodiments of the invention include a dual three-dimensional (3D) resistor structure with improved performance and reliability. These dual 3D resistor structures have increased current handling ability when compared with conventional resistor structures, and cause reduced joule heating in the circuitry in which they are located. In particular, the dual 3D resistors of various embodiments increase the effective width of the resistor when compared with the conventional structures, increasing current carrying capability and effective length (which maintains resistance).

Various particular embodiments of the invention include a dual 3D resistor structure. In some cases, the dual 3D resistor structure includes: a dielectric layer having: a first set of trenches extending in a first direction through the dielectric layer; and a second set of trenches each overlayed on a trench in the first set of trenches, the second set of trenches extending in a second direction through the dielectric layer, the second set of trenches and the first set of trenches forming at least one 3D trench. The dual 3D resistor structure further includes a resistor material overlying the dielectric layer and at least partially filling the 3D trench along the first direction and the second direction.

Various additional particular embodiments of the invention include a method of forming a dual three-dimensional (3D) resistor structure in a front end of line (FEOL) process. In these cases, the method can include: a) providing a FEOL dielectric material layer; b) forming a first set of trenches in a first direction through the FEOL dielectric layer; c) forming a second set of trenches each overlayed on a trench in the first set of trenches in a second direction through the FEOL dielectric layer, the second set of trenches and the first set of trenches forming at least one 3D trench; and d) forming a resistor material over the FEOL dielectric layer and at least partially filling the 3D trench along the first direction and the second direction.

Further particular aspects of the invention include a method of forming a dual three-dimensional (3D) resistor structure in a back end of line (BEOL) process. In these cases, the method can include: a) providing a BEOL dielectric material layer; b) forming a first set of trenches in a first direction through the FEOL dielectric layer; c) forming a second set of trenches each overlayed on a trench in the first set of trenches in a second direction through the BEOL dielectric layer, the second set of trenches and the first set of trenches forming at least one 3D trench; and d) forming a resistor material over the BEOL dielectric layer and at least partially filling the 3D trench along the first direction and the second direction.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Figure 1:
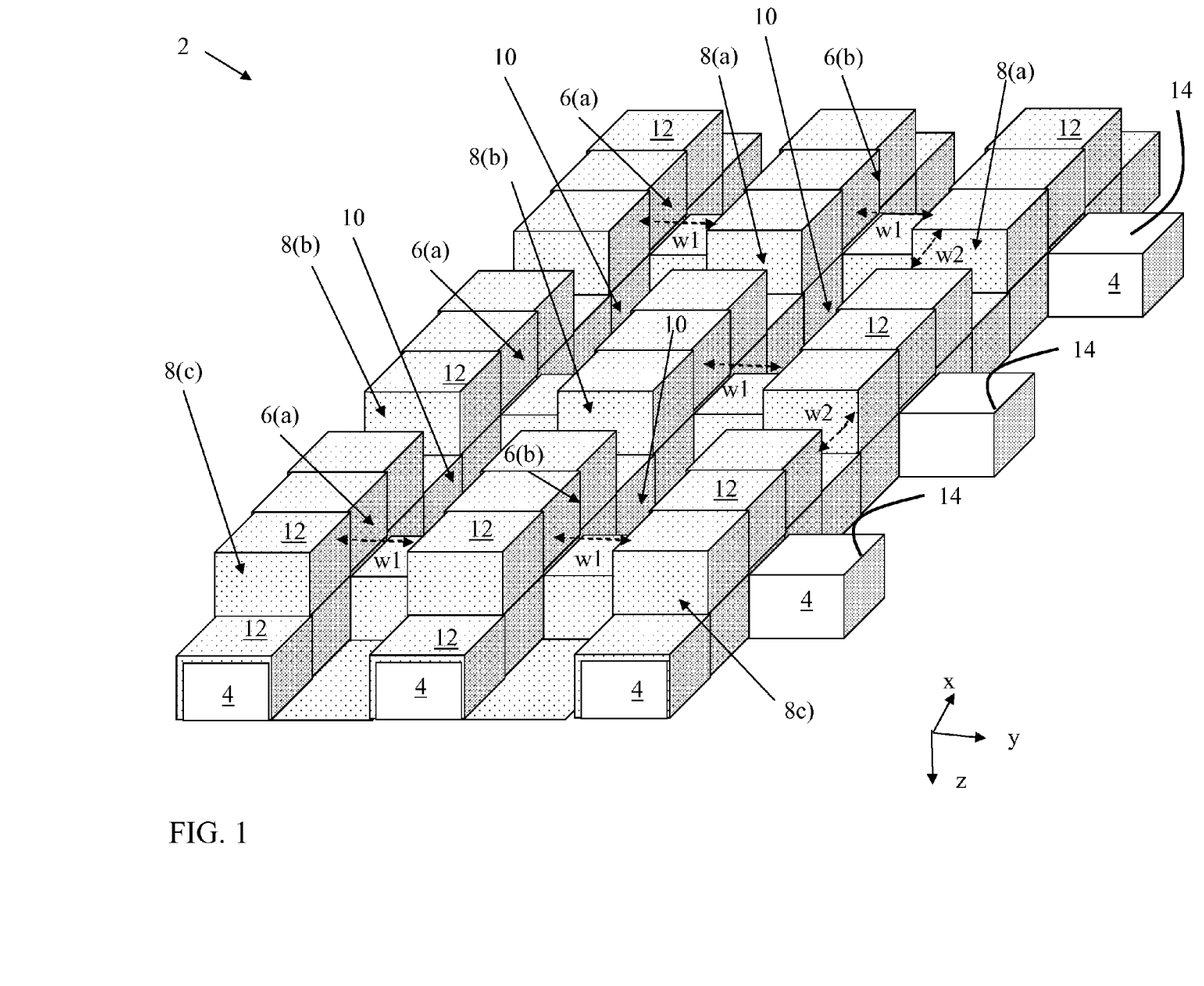
FIG. 1 shows a schematic three-dimensional depiction of a dual three-dimensional (3D) resistor structure according to various embodiments.

Turning to FIG. 1, a schematic depiction of a dual three-dimensional (3D) resistor structure 2 is shown according to various embodiments of the invention. As shown, the dual 3D resistor structure 2 can include a dielectric layer 4, which in some cases, can include an interlayer dielectric (ILD). In some cases, the dielectric layer 4 can be formed of any conventional dielectric material, e.g., silicon dioxide (SiO2), silicon oxygen fluoride (SiOF), silicon nitride (SiN), silicon carbide (SiC), carbo-silicon nitride (C—SiN), cadmium oxide (CdO) or combinations thereof. In some cases, where the dielectric layer 4 includes an ILD layer, that ILD can include at least one of: silicon nitride (Si3N4), silicon oxide (SiO2), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

It is understood that the dielectric layer 4 can be located within a front-end-of-the-line (FEOL) section of a semiconductor device, or a back-end-of-the-line (BEOL) section of a semiconductor device. As used herein, the term FEOL can refer to operations performed on the semiconductor wafer in the course of device manufacturing up to first metallization. Further, the term BEOL can refer to operations performed on the semiconductor wafer in the course of device manufacturing following first metallization.

With continuing reference to FIG. 1, the dielectric layer 4 of the dual 3D resistor structure 2 can include a first set of trenches 6 extending in a first direction (x) through the dielectric layer 4. The dielectric layer 4 can further include a second set of trenches 8 each overlayed on a trench (e.g., 6a, 6b, etc.) from the first set of trenches 6. The second set of trenches 8 (e.g., 8a, 8b, 8c, etc.) can extend in a second direction (y) through the dielectric layer 4. Collectively, the second set of trenches 8 and the first set of trenches 6 form at least one 3D trench 10 (a plurality shown).

In various embodiments, the first set of trenches 6 are aligned substantially perpendicularly with respect to the second set of trenches 8, that is, the second set of trenches 8 each include at least a component that is aligned perpendicularly with respect to the first set of trenches 6. More particularly, the second set of trenches 8 include a bi-directional trench that extends in both the (x) direction and the (y) direction.

In various embodiments, the first set of trenches 6 each have a first width (w1), and the second set of trenches 8 have a second width (w2) (in at least one of the (x) direction or the (y) direction). In some cases, w2 is distinct from w1. In some cases, w2 is approximately equal with w1.

The dual 3D resistor structure 2 can further include a resistor material 12 overlying the dielectric layer 4 and at least partially filling the 3D trench 10 along the first direction (x) and the second direction (y). The resistor material 12 can include at least one of: poly silicon (poly-Si), a diffusion sheet resistor material (diffusion), a sheet resistor material (Rx), bromine (Br), tantalum nitride (TaN), titanium nitride (TiN), alloyed titanium nitride (TiAN), titanium silicon nitride (TiSiN), tungsten (W), tungsten nitride (WN) or combinations thereof.

A portion of the resistor material 12 can overlie an upper surface 14 (partially obstructed in this view) of the dielectric layer 4 outside of the first set of trenches 6 and the second set of trenches 8, and can span between at least two 3D trenches 10 in the plurality of 3D trenches 10.

Figure 2:
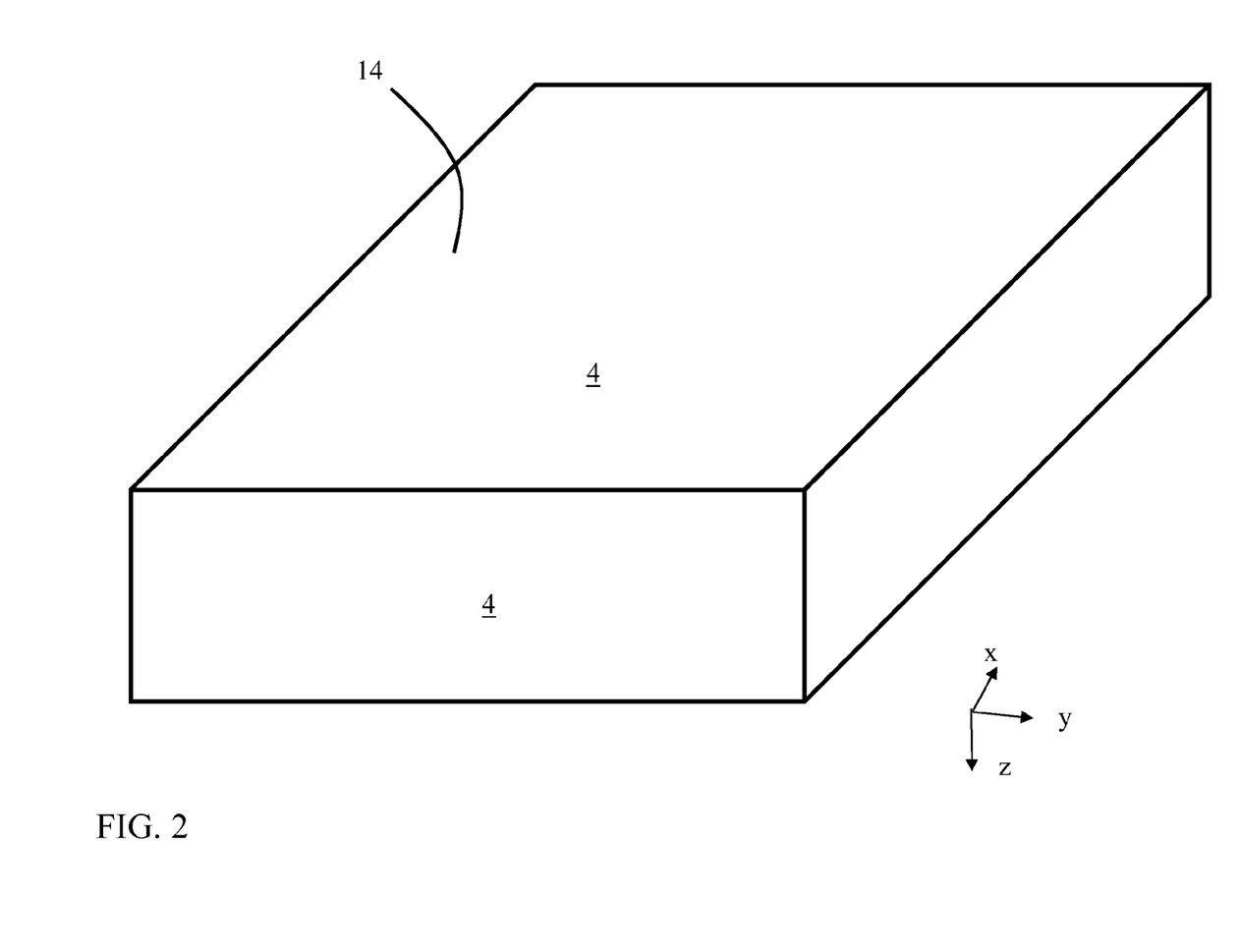
FIG. 2 shows a schematic three-dimensional depiction of a precursor dielectric layer undergoing processes according to various embodiments.
Figure 3:
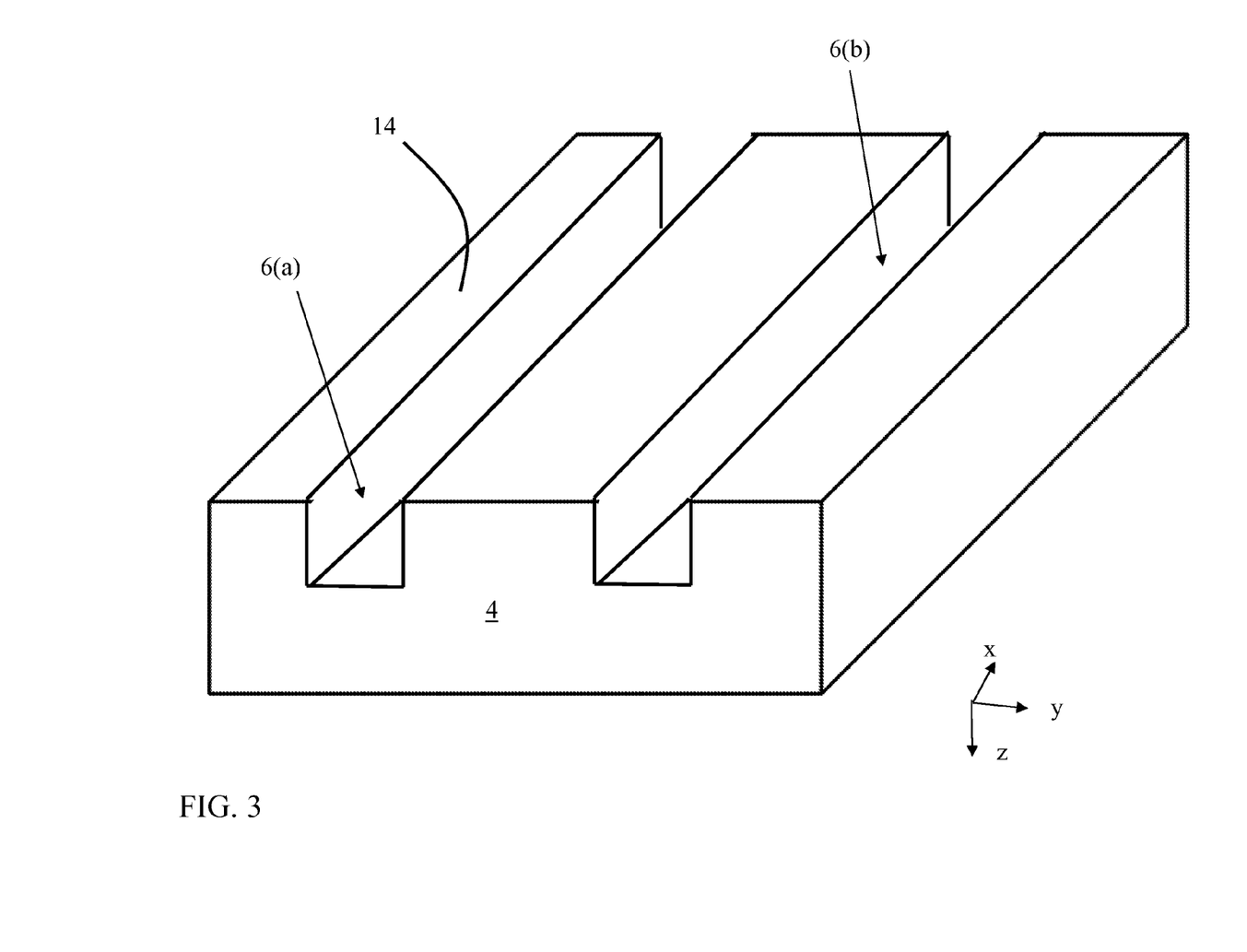
FIG. 3 illustrates a process performed on the precursor dielectric layer of FIG. 2 according to various embodiments.
Figure 4:
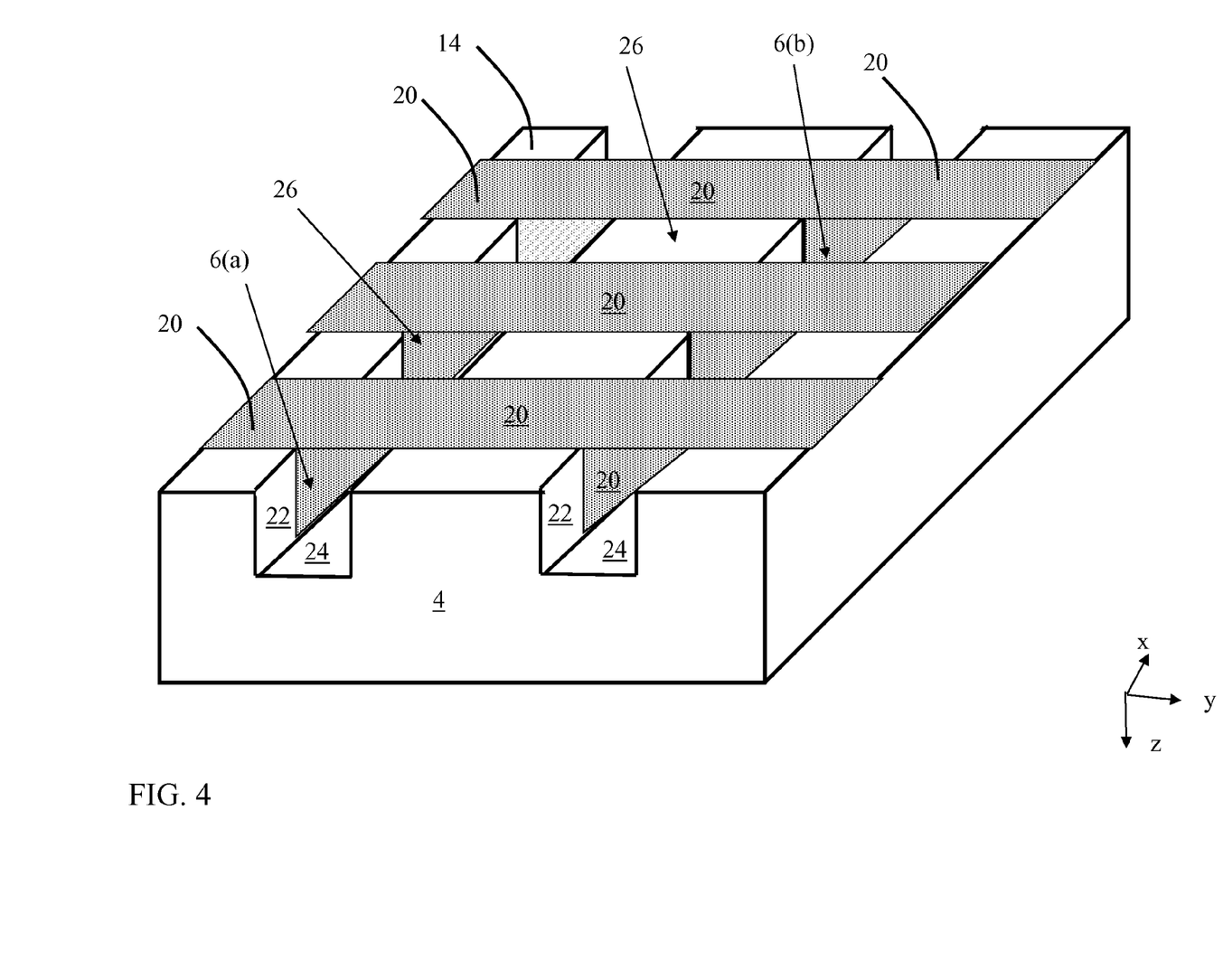
FIG. 4 illustrates a process performed on the structure of FIG. 3 according to various embodiments.
Figure 5:
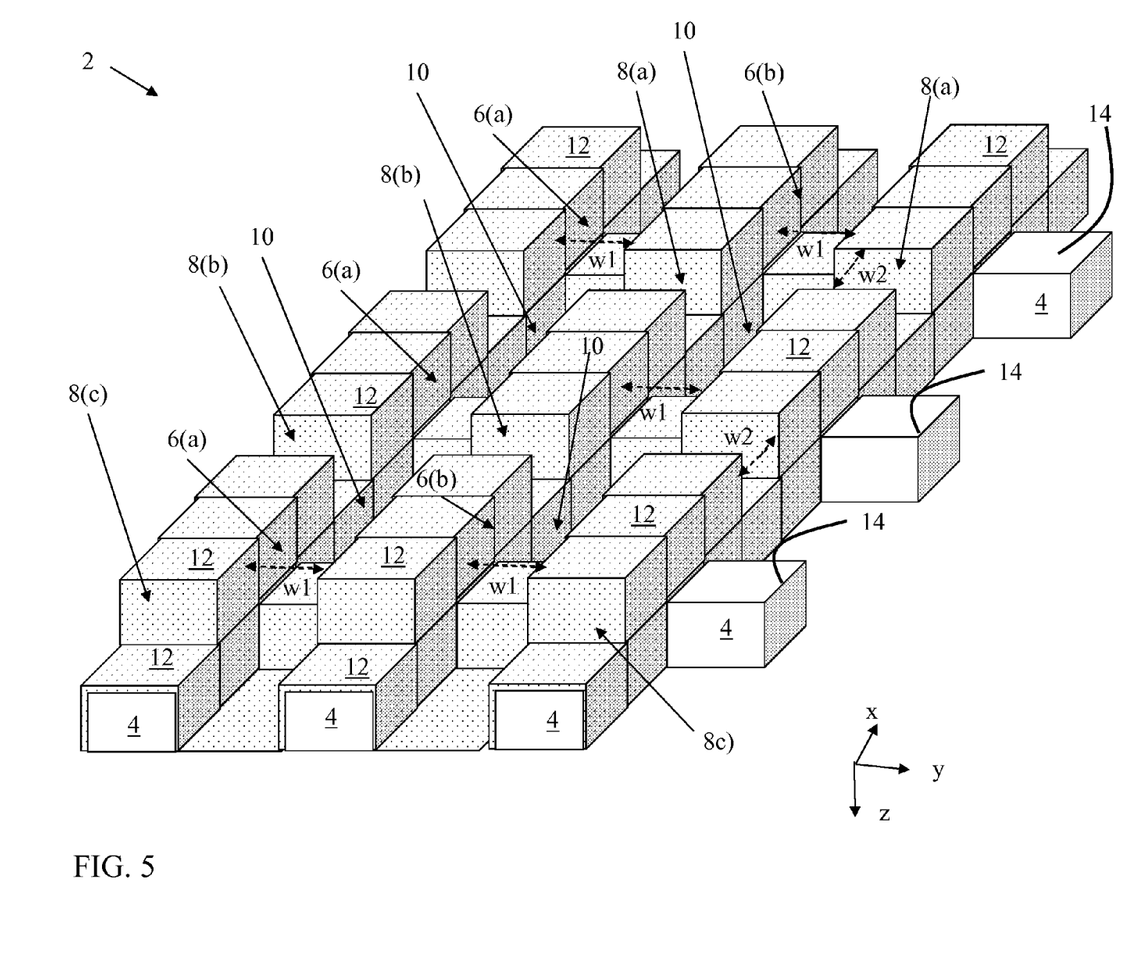
FIG. 5 shows a schematic three-dimensional depiction of a dual three-dimensional (3D) resistor structure formed according to processes illustrated in FIGS. 2-4, according to various embodiments.
Figure 6:
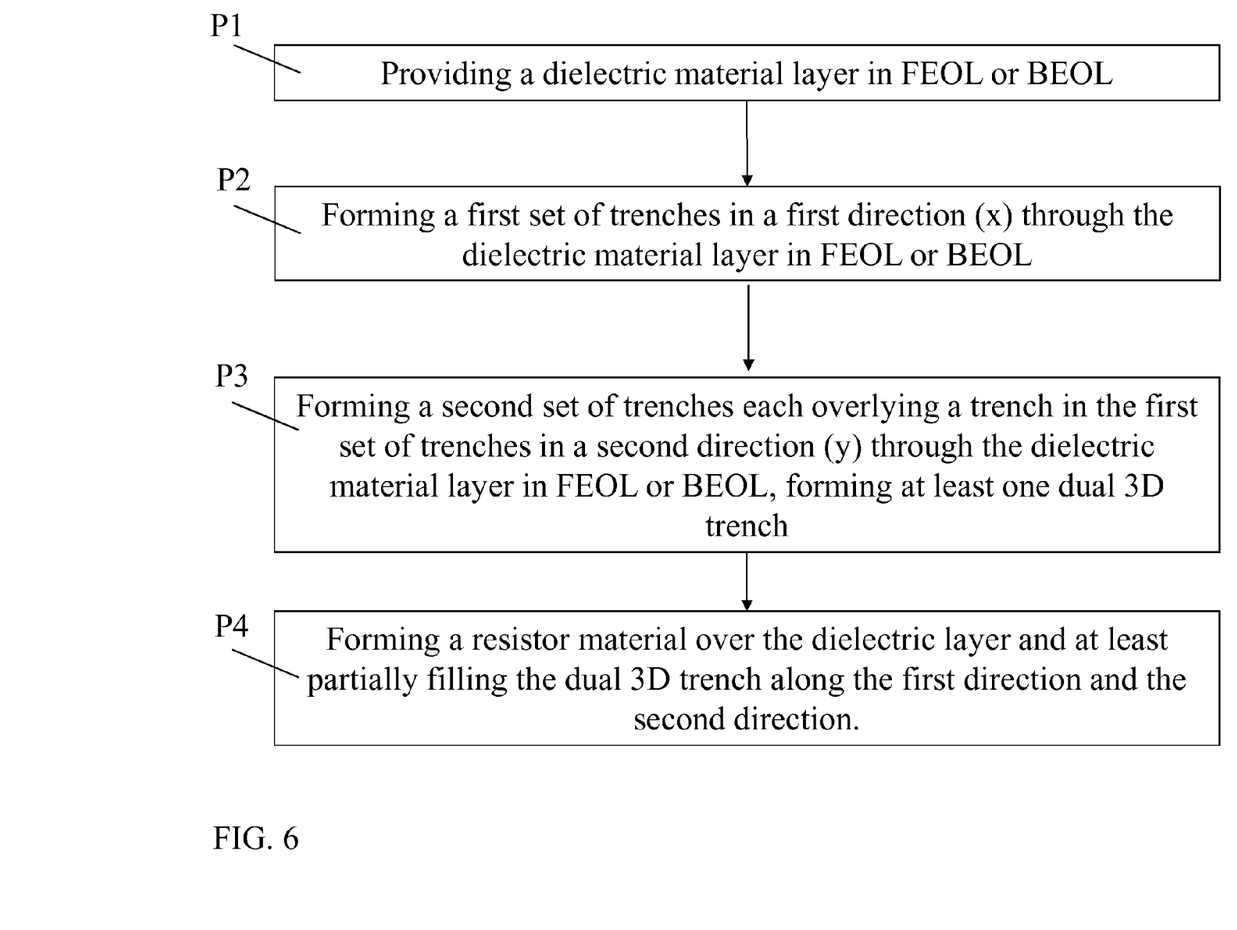
FIG. 6 depicts a flow diagram illustrating processes according to various embodiments.

Various embodiments of the invention can include methods of forming a dual 3D resistor structure (e.g., 3D resistor structure 2). FIGS. 2-4 illustrate processes in forming a dual 3D resistor structure as noted herein. FIG. 5 shows the dual 3D resistor structure formed according to various methods. FIG. 6 is a flow diagram illustrating processes according to various embodiments. In some cases, the 3D resistor structure 2 can be formed in a front-end-of-line (FEOL) process, e.g., in operations performed on a semiconductor wafer in the course of device manufacturing up to first metallization. In other cases, the 3D resistor structure 2 can be formed in a back-end-of-line (BEOL) process, e.g., in operations performed on a semiconductor wafer in the course of device manufacturing following first metallization. In either case, the process can include:

Process P1: providing a dielectric material layer (e.g., either BEOL dielectric material layer or FEOL dielectric material layer). The dielectric material layer can be formed of any dielectric material noted herein. An example dielectric material layer 4 is shown in FIG. 2;

Process P2: forming a first set of trenches in a first direction (x) through the FEOL dielectric layer. In various embodiments, the process of forming the first set of trenches includes performing a one-directional etch through the dielectric layer. This can include forming (e.g., depositing) a mask over the upper surface 14 of the FEOL dielectric layer 4, the mask having a plurality of parallel openings with a greater length in a first direction (e.g., x direction) than in a second direction (e.g., y direction). The process can then include etching the underlying FEOL dielectric layer 4 using the mask. This process is illustrated in FIG. 3;

Process P3: forming a second set of trenches (e.g., 8(*a*), 8(*b*), 8(*c*)) within the first set of trenches (e.g., 6(*a*), 6(*b*), etc.) in a second direction (y) through the dielectric layer 4, the second set of trenches (e.g., 8(*a*), 8(*b*), 8(*c*)) and the first set of trenches (e.g., 6(*a*), 6(*b*), etc.) forming at least one dual 3D trench 10. In various embodiments, the process of forming the second set of trenches includes performing a two-dimensional etch through the dielectric layer within the first set of trenches. That is, the second set of trenches can be formed in two directions, e.g., the second direction (y) and then in the first direction (x). In particular, this process can include forming at least one mask 20 (e.g., a hard mask) over portions of the upper surface 14 as well as along the sidewalls 22 and bottom 24 of each trench (6(*a*), 6(*b*)) in the first set of trenches. In various embodiments, the mask 20 has a greater length in a first direction (e.g., y direction) than in a second direction (e.g., x direction). In some cases, the mask 20 can include a plurality of openings 26 that have a greater length in a first direction (e.g., y direction) than in a second direction (e.g., x direction). In any case, after forming the mask 20 (e.g., via selective deposition), the process can include performing an etch on the exposed portions of the substrate 4, including at the upper surface 14 as well as within the trenches 6(*a*), 6(*b*), etc. FIG. 4 shows formation of the mask 20 used to form the second set of trenches 8 within the first set of trenches 6 according to various embodiments; and Process P4: after forming the at least one 3D trench (Process P3), this process can include forming a resistor material 12 over the dielectric layer 4 and at least partially filling the 3D trench 10 along the first direction (e.g., x or y) and the second direction (e.g., the other of x or y). In various embodiments, the process of forming the resistor material 12 includes removing the mask 20 used to form the second set of trenches (e.g., 8(*a*), 8(*b*), 8(*c*)), e.g., via conventional mask removal techniques such as using a bath, e.g., an acidic bath which reacts with the mask 20; and depositing the resistor material 12 over the dielectric layer 4 including the 3D trench. FIG. 5 shows formation of the resistor material 12 on (directly contacting) the upper surface 14 of the dielectric material layer.

When compared with conventional three-dimensional resistors, the dual 3D resistor structures shown and described herein are able to have an increased effective width without having to increase the length of the resistor. That is, the vertical surfaces formed in the dual 3D resistor structure act to increase the effective width and length of that resistor structure when compared with the prior art, without the need to take up more lateral (x or y direction) real estate in a circuit. The increased aspect ratio (depth (z) v. width (x and/or y)) of the dual 3D resistor helps to improve the current density in the resistor when compared with conventional 3D resistors.

As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 7:
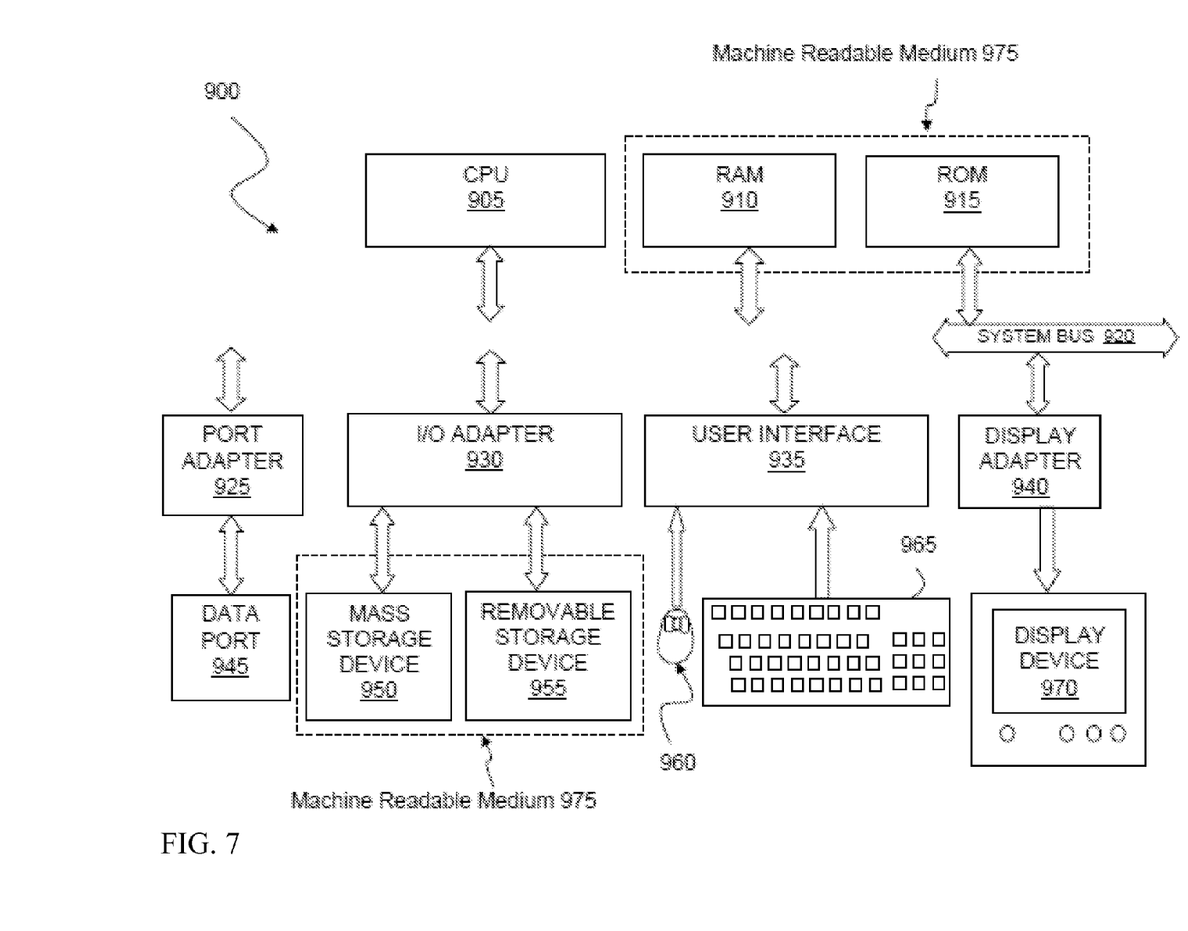
FIG. 7 depicts a block diagram of a computer system which can be used to implement the design structure described herein.

FIG. 7 depicts a block diagram of a general-purpose computer system 900 that can be used to implement a dual 3D resistor structure and the circuit design structure described herein. The design structure may be coded as a set of instructions on removable or hard media for use by the general-purpose computer 900. The computer system 900 has at least one microprocessor or central processing unit (CPU) 905. The CPU 905 is interconnected via a system bus 920 to machine readable media 975, which includes, for example, a random access memory (RAM) 910, a read-only memory (ROM) 915, a removable and/or program storage device 955, and a mass data and/or program storage device 950. An input/output (I/O) adapter 930 connects mass storage device 950 and removable storage device 955 to system bus 920. A user interface 935 connects a keyboard 965 and a mouse 960 to the system bus 920, a port adapter 925 connects a data port 945 to the system bus 920, and a display adapter 940 connects a display device 970. The ROM 915 contains the basic operating system for computer system 900. Examples of removable data and/or program storage device 955 include magnetic media such as floppy drives, tape drives, portable flash drives, zip drives, and optical media such as CD ROM or DVD drives. Examples of mass data and/or program storage device 950 include hard disk drives and non-volatile memory such as flash memory. In addition to the keyboard 965 and mouse 960, other user input devices such as trackballs, writing tablets, pressure pads, microphones, light pens and position-sensing screen displays may be connected to user interface 935. Examples of the display device 970 include cathode-ray tubes (CRT) and liquid crystal displays (LCD).

A machine readable computer program may be created by one of skill in the art and stored in computer system 900 or a data and/or any one or more of machine readable medium 975 to simplify the practicing of this invention. In operation, information for the computer program created to run the present invention is loaded on the appropriate removable data and/or program storage device 955, fed through data port 945, or entered using keyboard 965. A user controls the program by manipulating functions performed by the computer program and providing other data inputs via any of the above mentioned data input means. The display device 970 provides a way for the user to accurately control the computer program and perform the desired tasks described herein.

Figure 8:
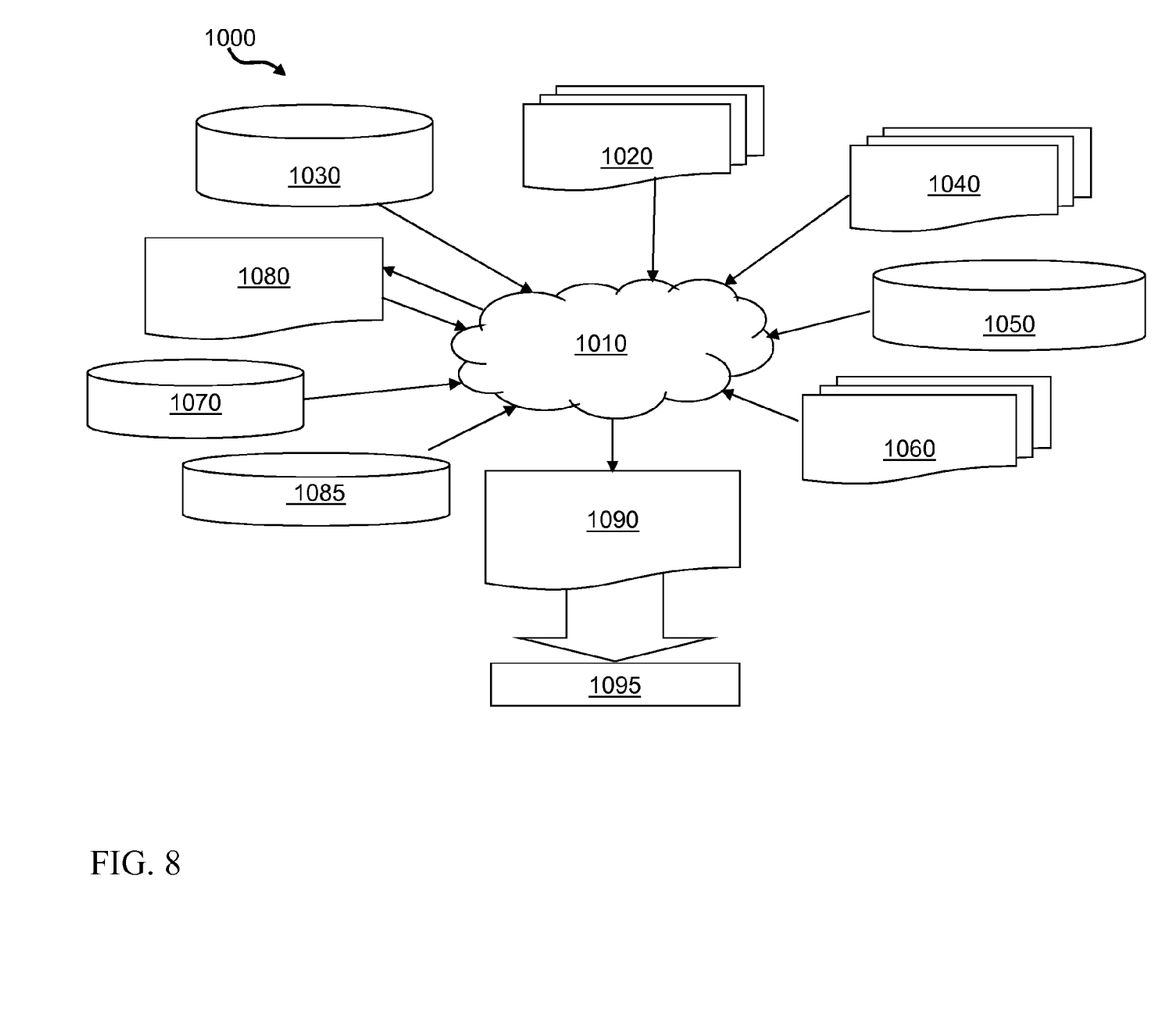
FIG. 8 depicts a block diagram of an example design flow according to various embodiments.

FIG. 8 shows a demonstrative illustration of a flow diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown in FIG. 1. The design structures processed and/or generated by design flow 1000 may be encoded on machine-readable transmission or storage media to include data and/or instructions that when executed or otherwise processed on a data processing system generate a logically, graphically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA).

FIG. 8 illustrates multiple such design structures (e.g., textual representations, graphical representations, data structural representations, etc.) including an input design structure 1020 that is preferably processed by a design process 1010. Design structure 1020 may be a logical simulation design structure generated and processed by design process 1010 to produce a logically equivalent functional representation of a hardware device, and may include a text or a graphical representation. Design structure 1020 may include at least one of a textual representation, a graphical representation, and a data structural representation of an integrated circuit and/or components thereof. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIG. 1. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIG. 1 to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit or semiconductor design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 1090 may comprise a compiled, executable HDL simulation model that functionally simulates the devices shown in FIG. 1.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 1090 may then proceed to a stage 1095 where, for example, design structure 1090: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A method of forming a dual three-dimensional (3D) resistor structure in a front end of line (FEOL) process, the method comprising:
   providing a FEOL dielectric material layer;
   forming a first set of trenches in a first direction through the FEOL dielectric layer;
   forming a second set of trenches overlayed on the first set of trenches in a second direction through the FEOL dielectric layer, the second set of trenches and the first set of trenches forming at least one dual 3D trench,
   wherein a portion of the second set of trenches is formed at a same depth as the first set of trenches in the FEOL dielectric material layer; and
   forming a resistor material over the FEOL dielectric layer and at least partially filling the at least one dual 3D trench along the first direction and the second direction.

2. The method of claim 1, wherein the forming of the first set of trenches includes performing a one-directional etch through the FEOL dielectric layer.

3. The method of claim 1, wherein the forming of the second set of trenches includes performing a two-dimensional etch through the FEOL dielectric layer within the first set of trenches.

4. The method of claim 1, wherein the forming of the resistor material includes depositing the resistor material over the FEOL dielectric layer including the at least one dual 3D trench.

5. The method of claim 1, wherein the FEOL dielectric layer includes at least one of: silicon dioxide (SiO2), silicon oxygen fluoride (SiOF), silicon nitride (SiN), silicon carbide (SiC), carbo-silicon nitride (C—SiN), cadmium oxide (CdO) or combinations thereof.

6. The method of claim 1, wherein the resistor material includes at least one of: poly silicon (poly-Si), a diffusion sheet resistor material, a sheet resistor material (Rx), bromine (Br), tantalum nitride (TaN), titanium nitride (TiN), alloyed titanium nitride (TiAN), titanium silicon nitride (TiSiN), tungsten (W), tungsten nitride (WN) or combinations thereof.

7. A method of forming a dual three-dimensional (3D) resistor structure in a front end of line (FEOL) process, the method comprising:
   providing a FEOL dielectric material layer;
   forming a first set of trenches in a first direction through the FEOL dielectric layer,
   wherein the forming of the first set of trenches includes:
      depositing a mask over an upper surface of the FEOL dielectric material layer, the mask having a plurality of parallel openings with a greater length in a first direction than in a second direction; and etching the underlying FEOL dielectric material layer using the mask;

forming a second set of trenches overlayed on the first set of trenches in the second direction through the FEOL dielectric layer, the second set of trenches and the first set of trenches forming at least one dual 3D trench, wherein the forming of the second set of trenches to form the at least one dual 3D trench includes:

forming an additional mask over portions of the upper surface of the FEOL dielectric material, portions of sidewalls of each of the first set of trenches, and a portion of a bottom of each of the first set of trenches; and etching exposed portions of the FEOL dielectric material not covered by the additional mask; and forming a resistor material over the FEOL dielectric layer and at least partially filling the at least one dual 3D trench along the first direction and the second direction.

8. The method of claim 7, wherein the additional mask has a greater length in the second direction than in the first direction.

9. The method of claim 8, wherein the etching of the exposed portions of the FEOL dielectric material not covered by the additional mask includes etching exposed portions of the upper surface of the FEOL dielectric material, exposed portions of sidewalls of each of the first set of trenches, and portions of the bottom of each of the first set of trenches.

10. The method of claim 7, wherein a portion of the second set of trenches is formed at a same depth as the first set of trenches in the FEOL dielectric material layer.

* * * * *